United States Patent
Woodward et al.

(10) Patent No.: US 7,339,509 B2
(45) Date of Patent: Mar. 4, 2008

(54) SAMPLING SYSTEM USING SAMPLING APERTURES OF DIFFERENT DURATIONS

(75) Inventors: Mark Joseph Woodward, Santa Rosa, CA (US); Marlin Viss, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/415,664

(22) Filed: May 2, 2006

(65) Prior Publication Data

US 2007/0257825 A1 Nov. 8, 2007

(51) Int. Cl.
*H03M 1/00* (2006.01)
(52) U.S. Cl. .................. 341/122; 341/123; 341/155
(58) Field of Classification Search ......... 341/122–123
See application file for complete search history.

(56) References Cited

U.S. PATENT DOCUMENTS

| | | | |
|---|---|---|---|
| 3,843,926 A * | 10/1974 | Espenlaub et al. .......... 324/102 |
| 4,353,057 A | 10/1982 | Bernet et al. | |
| 4,956,568 A | 9/1990 | Sue et al. | |
| 5,815,101 A * | 9/1998 | Fonte .......................... 341/123 |
| 6,438,366 B1 * | 8/2002 | Lindfors et al. ............ 455/334 |
| 6,564,160 B2 | 5/2003 | Jungerman et al. | |
| 6,573,761 B1 | 6/2003 | MacDonald et al. | |
| 6,650,101 B2 * | 11/2003 | MacDonald et al. ..... 324/76.24 |
| 6,700,516 B1 * | 3/2004 | MacDonald ................ 341/122 |
| 6,756,775 B2 | 6/2004 | Jungerman | |
| 6,856,924 B2 * | 2/2005 | MacDonald ................. 702/72 |
| 7,015,842 B1 * | 3/2006 | Gupta et al. ................ 341/122 |
| 7,132,965 B2 * | 11/2006 | Gupta et al. ................ 341/122 |
| 2007/0109159 A1 * | 5/2007 | Stein ........................... 341/61 |

OTHER PUBLICATIONS

Mark Kahrs, "50 Years of RF and Microwave Sampling", IEEE Transactions on Microwave Theory and Techniques, vol. 51, No. 6, Jun. 2003, pp. 1787-1805.

* cited by examiner

*Primary Examiner*—Khai M. Nguyen

(57) ABSTRACT

A signal sampling system includes an input signal and a plurality of samplers. The plurality of samplers produces a plurality of sample output signals. Each sampler from the plurality of samplers samples the input signal to produce a corresponding sample output signal from the plurality of sample output signals. Each sampler samples the input signal with a sampling pulse having a sampling aperture. A first sampling aperture used by a first sampler from the plurality of samplers to sample the input signal differs in duration from a second sampling aperture used by a second sampler from the plurality of samplers to sample the input signal.

20 Claims, 4 Drawing Sheets

SAMPLING SYSTEM USING SAMPLING APERTURES OF DIFFERENT DURATIONS

BACKGROUND

Equivalent-time sampling systems, such as those within oscilloscopes, are used to reconstruct the waveforms of electrical and optical signals. Within an equivalent-time sampling system, samples of an applied signal are acquired by a sampler. A time base within the equivalent-time sampling system establishes the timing of acquired samples. This allows reconstruction of a waveform of an applied signal. The reconstruction of the waveform can be displayed or stored for later use.

When reconstructing waveforms, it is sometimes desirable to perform linear feedforward equalization. A desired impulse response is achieved by use of uniformly spaced, weighted and summed samples from the input signal. The sampling durations used for sampling are typically identical and the tap spacing is commonly set to the bit period for digital data. For example, shift registers controlled by timing based on a data clock extracted from the input signal are typically used to provide the delay.

SUMMARY OF THE INVENTION

In accordance with embodiments of the present invention, a signal sampling system includes an input signal and a plurality of samplers. The plurality of samplers produces a plurality of sample output signals. Each sampler from the plurality of samplers samples the input signal to produce a corresponding sample output signal from the plurality of sample output signals. Each sampler samples the input signal with a sampling pulse having a sampling aperture. A first sampling aperture used by a first sampler from the plurality of samplers to sample the input signal differs in duration from a second sampling aperture used by a second sampler from the plurality of samplers to sample the input signal.

DESCRIPTION OF THE EMBODIMENT

Figure 1:
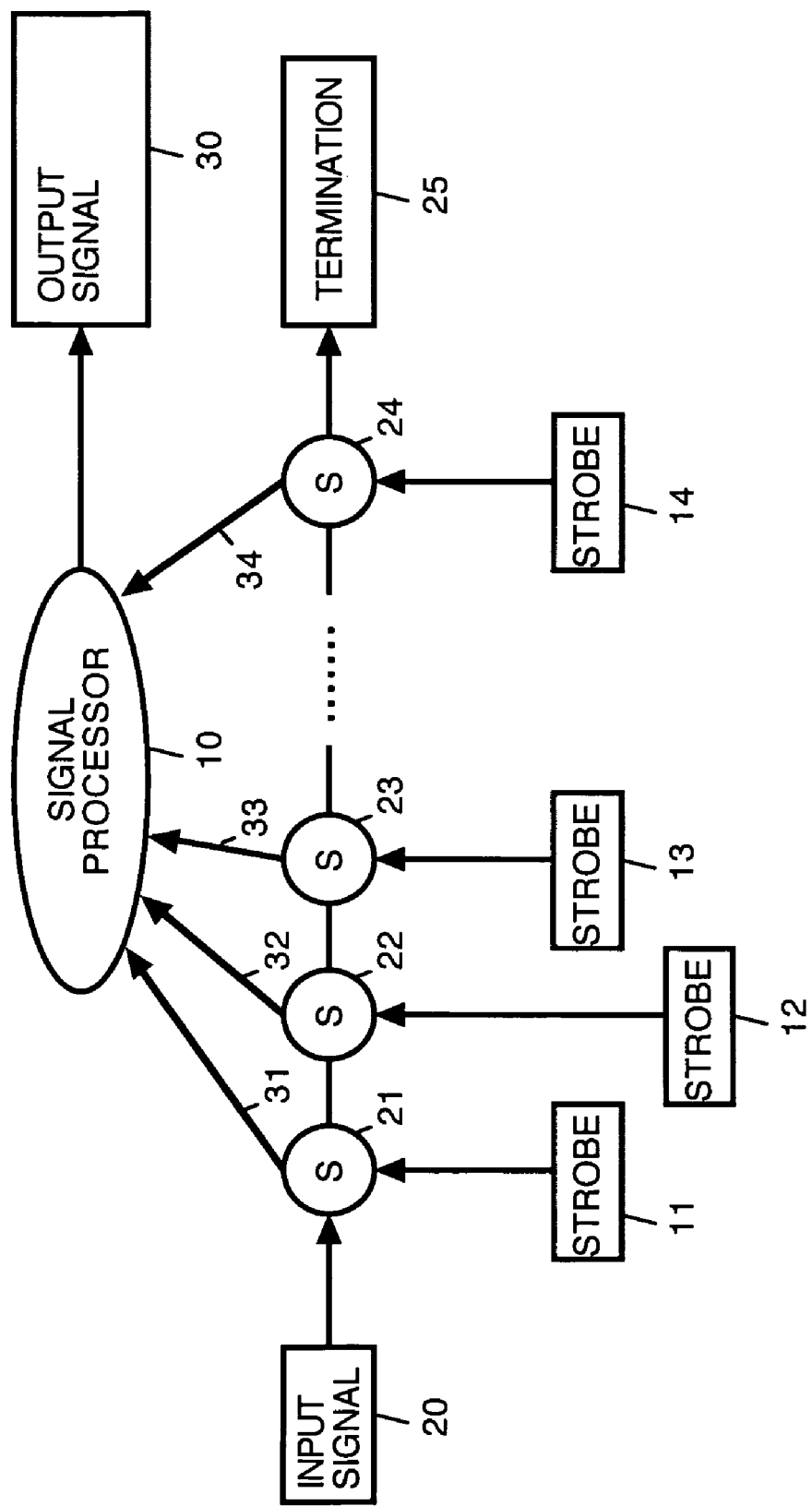
FIG. 1 is a block diagram of a serial matrix sampler topology in accordance with an embodiment of the present invention.

FIG. 1 is a block diagram of a serial matrix sampler topology. An input signal 20 is provided to a matrix of samplers. The matrix of samplers is illustrated in FIG. 1 by a sampler 21, a sampler 22, a sampler 23 and a sampler 24. The number of samplers used depends upon the application. For example, increasing the number of samplers can result in increasing the resolution, sensitivity and/or range at which input signal 20 can be detected. Each of samplers 21 through 24 is, for example, a sampler similar to that disclosed in U.S. Pat. No. 4,956,568 or another type of sampler as is selected to be optimal for a particular application.

Each sampler in the matrix of samplers is individually controlled by a separate strobe. For example, as shown in FIG. 1, sampler 21 is controlled by a strobe 11. Sampler 22 is controlled by a strobe 12. Sampler 23 is controlled by a strobe 13. Sampler 24 is controlled by a strobe 14. The timing characteristics of each of strobes 11 through 14 can be separately adjusted.

By separately controlling the timing characteristics of strobes 11 through 14, this allows flexibility in the sampling intervals at which input signal is sampled. For example, for a typical linear feedforward equalizer, an input signal is sampled at uniformly spaced time taps. Strobes 11 through 14 can be adjusted to allow for such uniformly spaced time samples of input signal 11. On the other hand, for some applications, it is desirable to vary the sampling interval between performing samples. For such applications, the sampling intervals between which strobes 11 through 14 generate pulses can be varied to achieve optimal intervals between performing samples.

Similarly, separately controlling the sampling aperture used by each of samplers 21 through 24, allows flexibility in the sampling duration at which each of samplers 21 through 24 perform samples. For example, for a typical linear feedforward equalizer, each time an input signal is sampled, it is sampled for a uniform sampling duration. The sampling apertures used by samplers 21 through 24 can be adjusted to allow for each sample duration to be equal. In this case, the sampling apertures used by samplers 21 through 24 all have the same value. On the other hand, for some applications, it is desirable to vary the sampling duration for which each of samplers 21 through 24 takes samples. For such applications, the sampling apertures used by samplers 21 through 244 can be varied to achieve optimal and varied sampling durations.

In the serial topology shown in FIG. 1, each of samplers 21 through 24 function as pass through samplers. That is, input signal 20 passes through sampler 21 to get to sampler 22. Input signal 20 passes through sampler 22 to get to sampler 23. Input signal 20 passes through sampler 23 to get to sampler 24. Input signal 20 passes through sampler 24 to get to a termination 25. For example, termination 25 is a 50 ohm termination.

As each sampler samples input signal 20 at sampling intervals and sampling durations, a sample output signal is generated. For example, as sampler 21 samples input signal 20 at sampling intervals and sampling durations, a sample output signal 31 is generated. As sampler 22 samples input signal 20 at sampling intervals and sampling durations, a sample output signal 32 is generated. As sampler 23 samples input signal 20 at sampling intervals and sampling durations, a sample output signal 33 is generated. As sampler 24 samples input signal 20 at sampling intervals and sampling durations, a sample output signal 34 is generated.

A signal processor 10 performs, for example, a scaled summation of the sample output signals. For example, the scaled summation is performed in software. Alternatively, signal processor 10 can be any hardware and/or software that is able to process signals in some fashion. For example, signal processor 10 digitizes sample output signals 31 through 34 and stores the digitized signals for operations performed by signal processor 10.

For example, the scaled summation produces a sum (s) in accordance with equation 1 set out below:

$$s = \sum_{i=1}^{i=n} k_i SO_i \qquad \text{Equation 1}$$

In Equation 1 above, $SO_i$ is the sample output signal of a sampler i. $k_i$ is a scaling constant by which sample output signal $SO_i$ is scaled for a particular application.

Signal processor 10 performs scaled summation of sample output signals 31 through 34 to produce an output signal 30.

The ability to vary timing characteristics (e.g., sampling aperture and sampling intervals) used for samplers 21 through 24, the ability to in software select scaling constants for each generated sample output and the ability to vary resolution, sensitivity and/or range by selecting the number of samplers provides for an abundance of flexibility making it practical to use the matrix of samplers for a variety of applications. For example, the matrix of samplers can be used in an equivalent time oscilloscope for equalization on live data, channel response shaping and filtering. It can also be used in serial data triggering on live data, time interval and jitter analysis and so on.

While for the majority of applications, signal processor 10 will perform a scaled summation, other types of mathematical operations, such as multiplication, may be performed on the captured sample output signals. As will be understood by persons of ordinary skill in the art, when the sample output signals are digitized and stored for operations performed in software, there are a wide variety of types of calculations that can be performed using information from the digitized intermediate signals.

Figure 2:
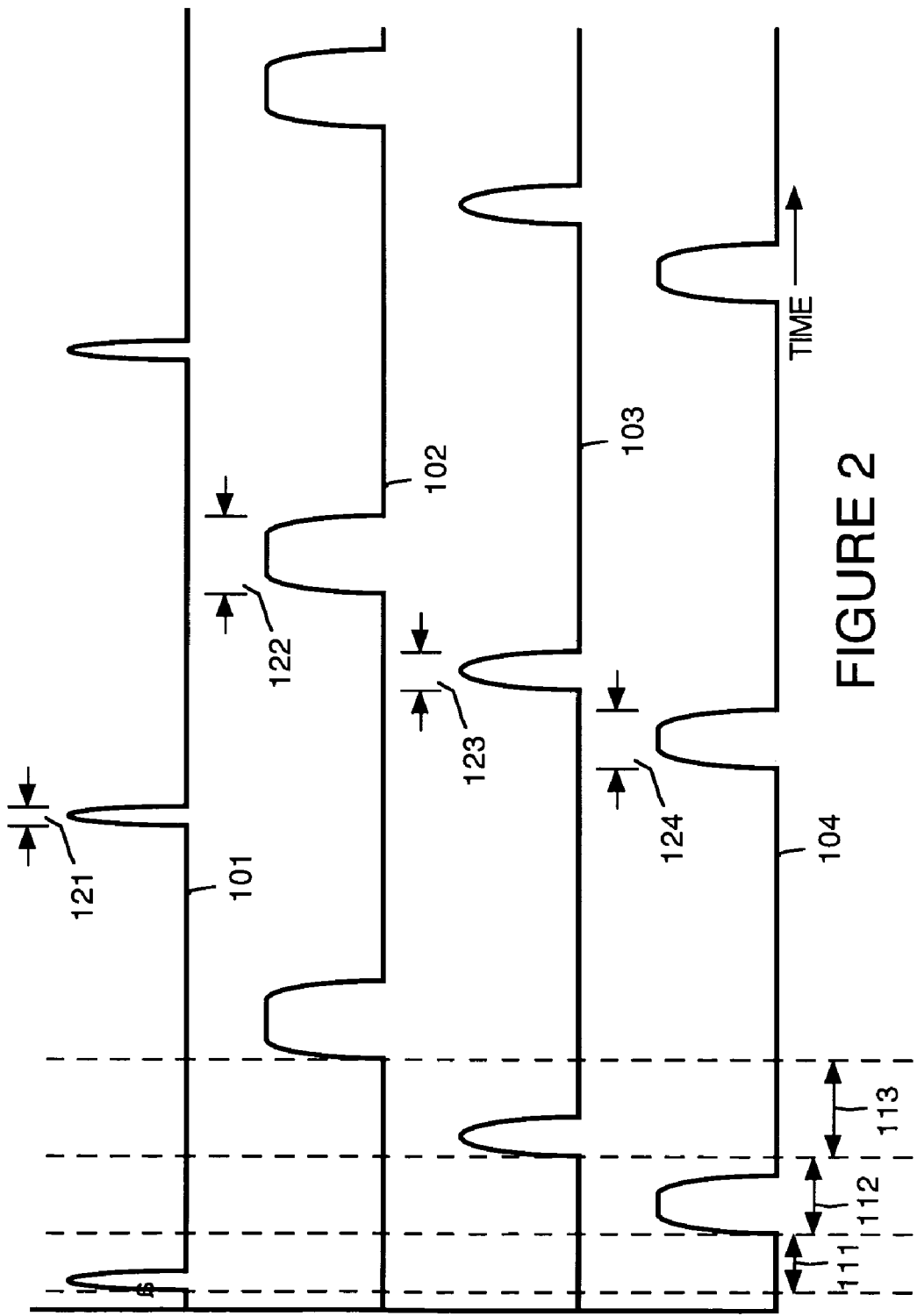
FIG. 2 is a simplified timing diagram illustrating variation of timing characteristics of strobes used to control samplers shown in FIG. 1, in accordance with an embodiment of the present invention.

FIG. 2 is a simplified timing diagram that illustrates variation of timing characteristics of samplers 21 through 24 shown in FIG. 1. For example, a waveform 101 illustrates the timing of sampler 21. A waveform 102 illustrates the timing of sampler 22. A waveform 103 illustrates the timing of sampler 23. A waveform 104 illustrates the timing of sampler 24.

Strobes 11 through 44 (shown in FIG. 1) control sampling of input signal 20 by samplers 21 through 24.

As can be seen from FIG. 2, samplers 21 through 24 each utilize sampling pulses during which input signal 20 is sampled. The order and frequency in which samplers 11 through 14 each activate sampling pulses can be selected by a designer to best fit the goals of the sampling system. For example, each sampling pulse is initiated by a strobe signal. For example, strobe 11 initiates sampling pulses by sampler 21. Strobe 12 initiates sampling pulses by sampler 22. Strobe 13 initiates sampling pulses by sampler 23. Strobe 14 initiates sampling pulses by sampler 24. As illustrated by waveform 101, each sampling pulse of sampler 11 (shown in FIG. 1) has a sampling aperture 121. Sampling aperture 121 is the duration of each sampling pulse sampler 11. Sampling aperture 121 of sampler 11 determines the sampling duration of sampler 21. As illustrated by waveform 102, each sampling pulse of sampler 12 (shown in FIG. 1) has a sampling aperture 122. As illustrated by waveform 103, each sampling pulse of sampler 13 has a sampling aperture 123. As illustrated by waveform 104, each sampling pulse of sampler 14 has a sampling aperture 124. The duration of a sampling aperture may be controlled either by adjusting sampler configuration or by adjusting timing of the strobe for the sampler. For example, the apertures shown in FIG. 2 represent the result of controlling the aperture either by using the strobe characteristics (varying strobe pulse duration) or alternatively by using the sampler conditions to vary the aperture while there is a uniform strobe pulse duration for all strobes.

As can be seen from FIG. 2, sampling aperture 121, sampling aperture 122, sampling aperture 123 and sampling aperture 124 differ in duration from each other. Because the timing characteristics of samplers 21 through 24 are separately variable, it is possible to vary sampling apertures of each sampler, and thus the sampling duration at which each sampler takes samples, in accordance with the needs of various applications.

Within a sampling sequence, sampling intervals are the intervals of time between samples being taken of input signal 20. For example, as shown in FIG. 2, a sampling interval 111 is the interval of time between sampler 21 sampling input signal 20, and sampler 24 sampling input signal 20. A sampling interval 112 is the interval of time between sampler 24 sampling input signal 20, and sampler 23 sampling input signal 20. A sampling interval 113 is the interval of time between sampler 23 sampling input signal 20, and sampler 22 sampling input signal 20. As can be seen from FIG. 2, sampling interval 111 differs from sampling interval 112 and from sampling interval 113. Because the timing characteristics of samplers 21 through 24 are separately variable, it is possible to vary sampling intervals in accordance with the needs of various applications.

Figure 3:
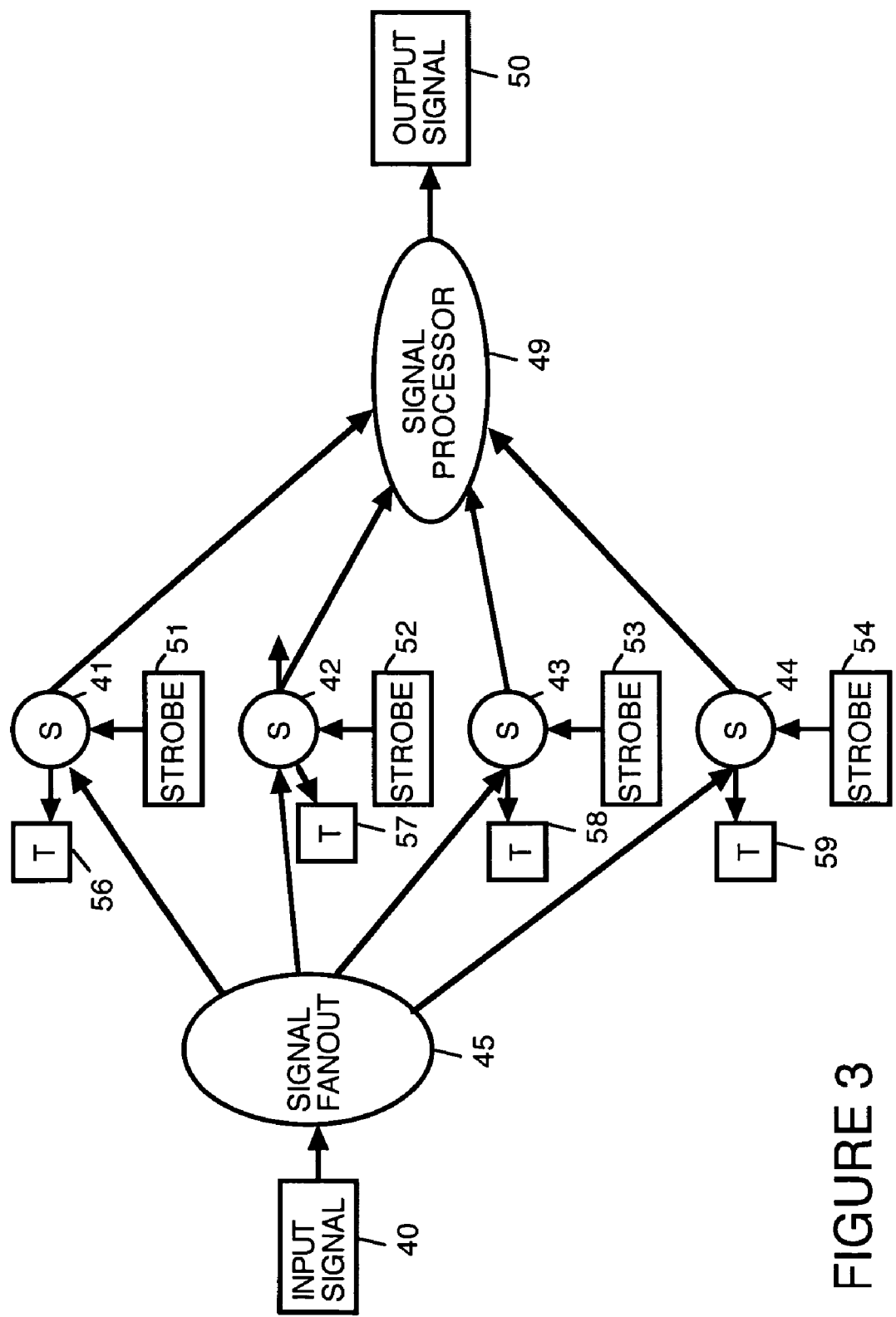
FIG. 3 is a block diagram of a parallel matrix sampler topology in accordance with another embodiment of the present invention.

Alternative to the serial matrix sampler topology, different topologies can be used in accordance with other embodiments of the invention. For example, FIG. 3 is a block diagram of a parallel matrix sampler topology. An input signal 40 is received by a signal fanout 45 that provides input signal 40 in parallel to a matrix of samplers. The matrix of samplers is illustrated in FIG. 3 by a sampler 41, a sampler 42, a sampler 43 and a sampler 44. The number of samplers used depends upon the application. For example, increasing the number of samplers can result in increasing the resolution, sensitivity and/or range at which input signal 40 can be detected. Samplers 41 through 44 are, for example, a sampler similar to that disclosed in U.S. Pat. No. 4,956,568 or another type of sampler as is selected to be optimal for a particular application.

Each sampler in the matrix of samplers is individually controlled by a separate strobe. For example, as shown in FIG. 3, sampler 41 is controlled by a strobe 51. Sampler 42 is controlled by a strobe 52. Sampler 43 is controlled by a strobe 53. Sampler 44 is controlled by a strobe 54. The sampling interval and sampling aperture for each of strobes 51 through 54 can be separately adjusted, as discussed above.

In the parallel topology shown in FIG. 3, each of samplers 41 through 44 is separately terminated. That is, input signal 40 passes through sampler 41 and is terminated by a termination (T) 56. Input signal 40 passes through sampler 42 and is terminated by a termination (T) 57. Input signal 40 passes through sampler 43 and is terminated by a termination (T) 58. Input signal 40 passes through sampler 44 and is terminated by a termination (T) 59. For example, terminations 56 through 59 are each a 50 ohm termination.

A signal processor 49 performs, for example, a scaled summation of the sample output signals from each of samplers 41 through 44. For example, the scaled summation is performed in software. For example, signal processor 49 digitizes the sample output signals and stores the digitized signals for operations performed by signal processor 49.

For example, the scaled summation produces a sum (S) in accordance with equation 1 set out above.

Signal processor 49 performs scaled summation of sample output to produce an output signal 50.

The ability to vary timing characteristics (e.g., sampling aperture and sampling intervals) used for strobes 51 through 54, the ability to in software select scaling constants for each generated sample output and the ability to vary resolution, sensitivity and/or range by selecting the number of samplers provides for an abundance of flexibility making it practical to use the matrix of samplers for a variety of applications, as further discussed above.

While for the majority of applications, signal processor 49 will perform a scaled summation, other types of mathematical operations may be performed on the captured sample output signals. As will be understood by persons of ordinary skill in the art, when the sample output signals are digitized and stored for operations performed in software, there are a wide variety of types of calculations that can be performed using information from the digitized intermediate signals.

When using a serial matrix topology, such as shown in FIG. 1, each time the input signal is propagated through a sampler, slight degradation of the input signal occurs. Depending on the accuracy required by a particular application, this can limit the amount of samplers that can be arranged in a serial matrix topology. Likewise, when using a parallel matrix topology, such as shown in FIG. 3, as the number of samplers is increased, this requires the number of outputs of a signal fanout to be increased. This increases the attenuation and thus the amplification needed to provide the input signal to each sampler. The resulting increase in signal to noise ratio can limit the amount of samplers that can be arranged in a parallel matrix topology.

For some applications, a combination topology can present the best way to provide the input signal to a large number of samplers. One example of a combined serial-parallel matrix topology is shown in FIG. 4.

Figure 4:
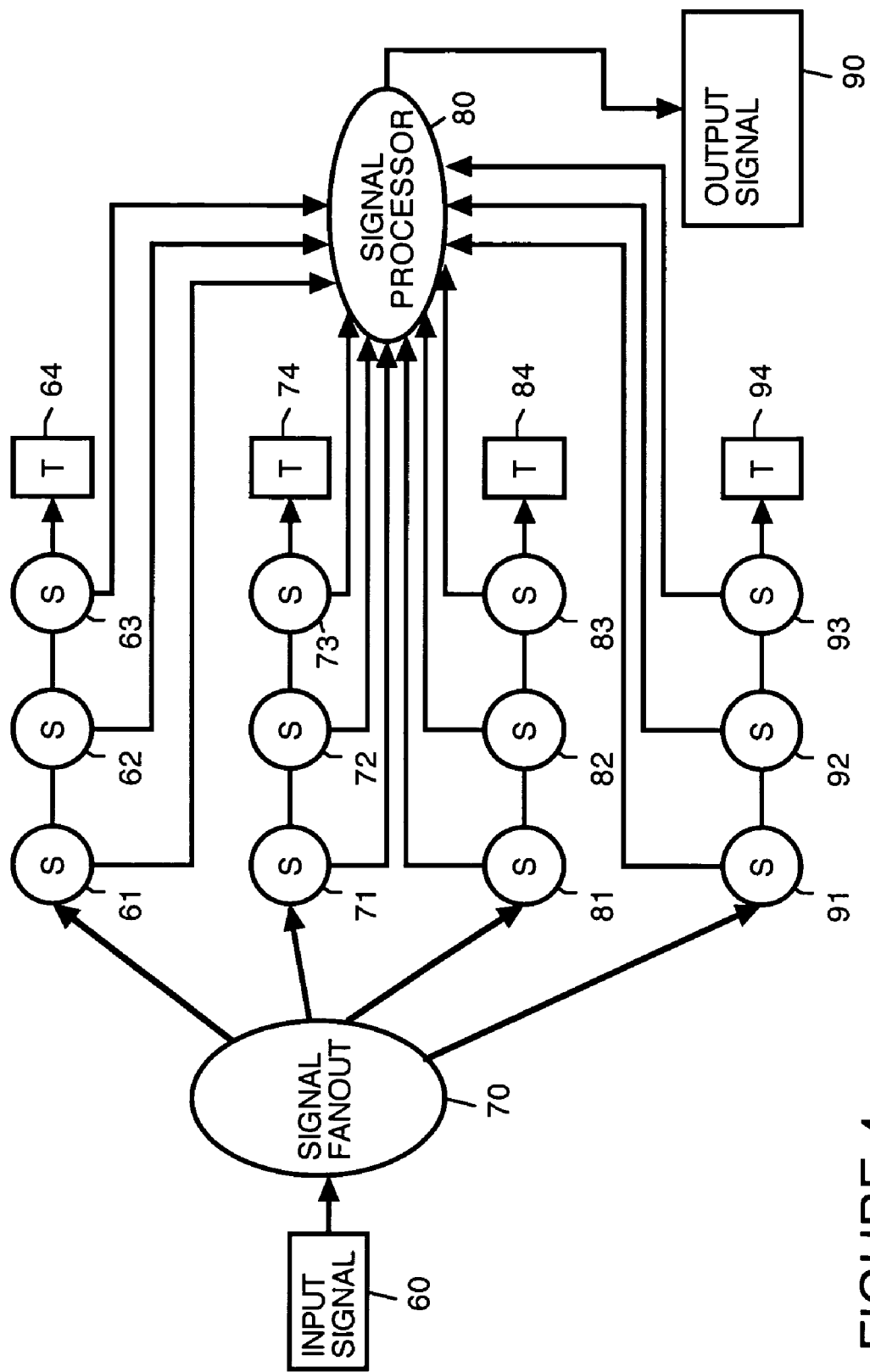
FIG. 4 is a block diagram of a combined serial-parallel matrix sampler topology in accordance with another embodiment of the present invention.

As shown in FIG. 4, a matrix of samplers is composed of a sampler 61, a sampler 62, a sampler 63, a sampler 64, a sampler 71, a sampler 72, a sampler 73, a sampler 74, a sampler 81, a sampler 82, a sampler 83, a sampler 84, a sampler 91, a sampler 92, a sampler 93 and a sampler 94. The number of samplers used depends upon the application.

An input signal 60 is received by a signal fanout 70. Signal fanout 70 provides input signal 60 to samplers 61, 71, 81 and 91. Input signal 60 gets passed through sampler 61, 62 and 63 to termination 64. Similarly, input signal 60 gets passed through sampler 71, 72 and 73 to termination 74. Input signal 60 gets passed through sampler 81, 82 and 83 to termination 84. Input signal 60 gets passed through sampler 91, 92 and 93 to termination 94.

Each sampler in the matrix of samplers shown in FIG. 4 is individually controlled by a separate strobe (not shown). By separately controlling the timing characteristics of strobes, this allows flexibility in the sampling intervals and sampling aperture at which input signal 60 is sampled.

A signal processor 80 performs, for example, a scaled summation of the sample output signals from each of samplers shown in FIG. 4. For example, the scaled summation is performed in software. For example, signal processor 80 digitizes the sample output signals and stores the digitized signals for operations performed by signal processor 80.

For example, the scaled summation produces a sum (S) in accordance with equation 1 set out above.

Signal processor 80 performs scaled summation of sample output to produce an output signal 90.

While for the majority of applications, signal processor 80 will perform a scaled summation, other types of mathematical operations may be performed on the captured sample output signals, as further discussed above.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A signal sampling system comprising:
    an input signal; and
    a plurality of samplers that produces a plurality of sample output signals, wherein each sampler from the plurality of samplers samples the input signal to produce a corresponding sample output signal from the plurality of sample output signals;
    wherein each sampler samples the input signal with a sampling pulse having a sampling aperture; and,
    wherein a first sampling aperture used by a first sampler from the plurality of samplers to sample the input signal differs in duration from a second sampling aperture used by a second sampler from the plurality of samplers to sample the input signal.

2. The signal sampling system of claim 1, wherein within a sampling sequence in which each sampler from the plurality of samplers samples the input signal once and only once, sampling intervals between which the samplers sample the input signal are not uniform.

3. The signal sampling system of claim 1 additionally comprising:
    a signal processor that performs a scaled summation of the sample output signals.

4. The signal sampling system of claim 1 additionally comprising:
    a signal processor that performs a scaled summation of the sample output signals using software.

5. The signal sampling system of claim 1 wherein each sampler from the plurality of samplers utilizes a sampling aperture that differs in duration from all other samplers in the plurality of samplers.

6. The signal sampling system of claim 1 additionally comprising:
    a plurality of strobes that control when the plurality of samplers sample the input signal, wherein each strobe from the plurality of strobes controls when a corresponding sampler from the plurality of samplers samples the input signal.

7. A signal sampling system comprising:
    an input signal; and
    a plurality of samplers that produces a plurality of sample output signals, wherein each sampler from the plurality of samplers samples the input signal to produce a corresponding sample output signal from the plurality of sample output signals;
    wherein each sampler samples the input signal with a sampling pulse having a sampling aperture; and,
    wherein a first sampling aperture used by a first sampler from the plurality of samplers to sample the input signal differs in duration from a second sampling aperture used by a second sampler from the plurality of samplers to sample the input signal,
    wherein samplers in the plurality of samplers are organized in a serial matrix topology so that the input signal serially passes through the plurality of samplers and is terminated by a single terminator.

8. A signal sampling system comprising:

an input signal; and, a plurality of samplers that produces a plurality of sample output signals, wherein each sampler from the plurality of samplers samples the input signal to produce a corresponding sample output signal from the plurality of sample output signals;

wherein each sampler samples the input signal with a sampling pulse having a sampling aperture;

wherein a first sampling aperture used by a first sampler from the plurality of samplers to sample the input signal differs in duration from a second sampling aperture used by a second sampler from the plurality of samplers to sample the input signal; and a signal fanout; and, a plurality of terminations arranged so that each sampler from the plurality of samplers is separately terminated by a termination from the plurality of terminations, wherein the samplers in the plurality of samplers are organized in a parallel matrix topology so that each sampler from the plurality of samplers receives the input signal from the signal fanout.

9. A signal sampling system comprising:

an input signal; and, a plurality of samplers that produces a plurality of sample output signals, wherein each sampler from the plurality of samplers samples the input signal to produce a corresponding sample output signal from the plurality of sample output signals;

wherein each sampler samples the input signal with a sampling pulse having a sampling aperture;

wherein a first sampling aperture used by a first sampler from the plurality of samplers to sample the input signal differs in duration from a second sampling aperture used by a second sampler from the plurality of samplers to sample the input signal; and a signal fanout; and, a plurality of terminations arranged so that each termination from the plurality of terminations provides termination for a subgroup of samplers from the plurality of samplers, each subgroup of samplers receiving the input signal from the signal fanout, the input signal passing through each sampler in the subgroup of samplers until being terminated by termination from the plurality of terminations, thereby the samplers being organized in a combined serial-parallel matrix topology.

10. A method for performing signal sampling, comprising:

sampling an input signal by a plurality of samplers to produce a plurality of sample output signals, including:

sampling the input signal by each sampler from the plurality of samplers to produce a corresponding sample output signal from the plurality of sample output signals, including:

sampling the input signal with sampling pulses, each sampling pulse defining a sampling aperture, wherein a first sampling aperture used by a first sampler from the plurality of samplers to sample the input signal differs in duration from a second sampling aperture used by a second sampler from the plurality of samplers to sample the input signal; and processing the sample output signal to produce an output signal.

11. The method of claim 10, wherein sampling the input signal by each sampler includes:

sampling the input signal within a sampling sequence in which each sampler from the plurality of samplers samples the input signal once and only once, wherein within the sampling sequence sampling intervals between which the samplers sample the input signal are not uniform.

12. The method of claim 10 wherein processing the sample output signals includes performing a scaled summation of the sample output signals.

13. The method of claim 10 additionally comprising:

controlling when the plurality of samplers sample the input signal using a plurality of strobes, each strobe from the plurality of strobes controlling when a corresponding sampler from the plurality of samplers samples the input signal.

14. A signal sampling system comprising:

sampling means for producing a plurality of sample output signals, wherein the sampling means separately samples the input signal to produce each sample output signal from the plurality of sample output signals and, control means for controlling the sampling means, the controlling means including a plurality of strobes that control when the sampling means samples the input signal, wherein each strobe from the plurality of strobes controls when the sampling means samples the input signal;

wherein the sampling means samples the input signal with a sampling pulse having a sampling aperture; and, wherein the sampling means includes a first sampler and a second sampler, a first sampling aperture used by the first sampler to sample the input signal differs in duration from a second sampling aperture used by the second sampler to sample the input signal.

15. The signal sampling system of claim 14, wherein within a sampling sequence within which the sampling means samples the input signal once and only once for each strobe within the plurality of strobes, sampling intervals, between which the sampling means samples the input signal, are not uniform.

16. The signal sampling system of claim 14 additionally comprising:

processor means for performing a scaled summation of the sample output signals.

17. The signal sampling system of claim 14 additionally comprising:

processor means for performing a multiplication of the sample output signals.

18. A signal sampling system comprising:

sampling means for producing a plurality of sample output signals, wherein the sampling means separately samples the input signal to produce each sample output signal from the plurality of sample output signals and, control means for controlling the sampling means, the controlling means including a plurality of strobes that control when the sampling means samples the input signal, wherein each strobe from the plurality of strobes controls when the sampling means samples the input signal;

wherein the sampling means samples the input signal with a sampling pulse having a sampling aperture; and, wherein the sampling means includes a first sampler and a second sampler, a first sampling aperture used by the first sampler to sample the input signal differs in duration from a second sampling aperture used by the second sampler to sample the input signal, wherein the sampling means comprises a plurality of samplers that includes the first sampler and the second sampler, wherein samplers in the plurality of samplers are organized in a serial matrix topology so that the input signal serially passes through the plurality of samplers and is terminated by a single terminator.

19. A signal sampling system comprising:
sampling means for producing a plurality of sample output signals, wherein the sampling means separately samples the input signal to produce each sample output signal from the plurality of sample output signals and,
control means for controlling the sampling means, the controlling means including a plurality of strobes that control when the sampling means samples the input signal, wherein each strobe from the plurality of strobes controls when the sampling means samples the input signal;
wherein the sampling means samples the input signal with a sampling pulse having a sampling aperture; and,
wherein the sampling means includes a first sampler and a second sampler, a first sampling aperture used by the first sampler to sample the input signal differs in duration from a second sampling aperture used by the second sampler to sample the input signal,
wherein the sampling means comprises a plurality of samplers that includes the first sampler and the second sampler, the signal sampling system additionally comprising:
a signal fanout; and,
a plurality of terminations arranged so that each sampler from the plurality of samplers is separately terminated by a termination from the plurality of terminations;
wherein the samplers in the plurality of samplers are organized in a parallel matrix topology so that each sampler from the plurality of samplers receives the input signal from the signal fanout.

20. A signal sampling system comprising:
sampling means for producing a plurality of sample output signals, wherein the sampling means separately samples the input signal to produce each sample output signal from the plurality of sample output signals and,
control means for controlling the sampling means, the controlling means including a plurality of strobes that control when the sampling means samples the input signal, wherein each strobe from the plurality of strobes controls when the sampling means samples the input signal;
wherein the sampling means samples the input signal with a sampling pulse having a sampling aperture; and,
wherein the sampling means includes a first sampler and a second sampler, a first sampling aperture used by the first sampler to sample the input signal differs in duration from a second sampling aperture used by the second sampler to sample the input signal;
wherein the sampling means comprises a plurality of samplers that includes the first sampler and the second sampler, the signal sampling system additionally comprising:
a signal fanout, and,
a plurality of terminations arranged so that each termination from the plurality of terminations provides termination for a subgroup of samplers from the plurality of samplers, each subgroup of samplers receiving the input signal from the signal fanout, the input signal passing through each sampler in the subgroup of samplers until being terminated by termination from the plurality of terminations, thereby the samplers being organized in a combined serial-parallel matrix topology.

* * * * *